US00RE48737E

(19) United States
(12) Reissued Patent
Hu et al.

(10) Patent Number: US RE48,737 E
(45) Date of Reissued Patent: Sep. 14, 2021

(54) SCAN DRIVER AND ORGANIC LIGHT-EMITTING DISPLAY USING SAME

(71) Applicants: Kunshan New Flat Panel Display Technology Center Co., Ltd., Kunshan (CN); KunShan Go-Visionox Opto-Electronics Co., Ltd., Kunshan (CN)

(72) Inventors: Siming Hu, Kunshan (CN); Hui Zhu, Kunshan (CN); Xiuqi Huang, Kunshan (CN); Xiaoyu Gao, Kunshan (CN)

(73) Assignees: KUNSHAN NEW FLAT PANEL DISPLAY TECHNOLOGY CENTER CO., LTD., Kunshan (CN); KUNSHAN GO-VISIONOX OPTO-ELECTRONICS CO., LTD., Kunshan (CN)

(21) Appl. No.: 16/416,284

(22) Filed: May 20, 2019

Related U.S. Patent Documents

Reissue of:
(64) Patent No.: 9,847,062
Issued: Dec. 19, 2017
Appl. No.: 15/108,284
PCT Filed: Dec. 24, 2014
PCT No.: PCT/CN2014/094751
§ 371 (c)(1),
(2) Date: Jul. 14, 2016
PCT Pub. No.: WO2015/096721
PCT Pub. Date: Jul. 2, 2015

(51) Int. Cl.
*G09G 5/00* (2006.01)
*G09G 3/3266* (2016.01)
(Continued)

(52) U.S. Cl.
CPC ..... *G09G 3/3266* (2013.01); *G09G 3/3291* (2013.01); *G11C 19/28* (2013.01);
(Continued)

(58) Field of Classification Search
None
See application file for complete search history.

(56) References Cited

U.S. PATENT DOCUMENTS 6,339,631 B1 1/2002 Yeo et al.
6,556,646 B1 * 4/2003 Yeo ..... G09G 3/3677 377/54
(Continued)

FOREIGN PATENT DOCUMENTS

CN 1937020 A 3/2007
CN 1937022 A 3/2007
(Continued)

*Primary Examiner* — John M Hotaling
(74) *Attorney, Agent, or Firm* — Bayramoglu Law Offices LLC

(57) ABSTRACT

The present invention provides a scanning driver and an organic light-emitting display using the same. The scanning driver comprises a plurality of cascaded structures receiving signals from a first timing clock line (CK1) and a second timing clock line (CK2) with opposite phases, the cascaded structures successively generating output signals (i.e., scanning signals), wherein each of the cascaded structures comprises: a first transistor, connected to a starting signal line or to a scanning output line of a previous cascaded structure; a second transistor, connected to the second timing clock line and to the scanning output line; a third transistor connected to a high-level power supply VGH; a fourth transistor, connected to a low-level power supply VGL and to an output terminal of the third transistor; a fifth transistor, connected to a high-level power supply VGH and to a scanning output line; and a first capacitor, connected between an output terminal of the first transistor and the scanning output line. Arranging a first capacitor C1 between the output terminal of M1 and the scanning output line prevents slight-ON of M2, thus reducing the reverse current at the scanning driver and reducing the power consumption.

19 Claims, 5 Drawing Sheets

(51) Int. Cl.
*G09G 3/3291* (2016.01)
*G11C 19/28* (2006.01)

(52) U.S. Cl.
CPC ..... *G09G 2310/0283* (2013.01); *G09G 2310/0286* (2013.01); *G09G 2310/08* (2013.01); *G09G 2320/0219* (2013.01); *G09G 2330/021* (2013.01)

(56) References Cited

U.S. PATENT DOCUMENTS

| | | | | |
|---|---|---|---|---|
| 7,982,704 | B2 * | 7/2011 | Shin | G09G 3/3275 345/100 |
| 8,866,859 | B2 * | 10/2014 | Chung | G09G 3/3266 345/204 |
| 2003/0002615 | A1 | 1/2003 | Morosawa et al. | |
| 2007/0063950 | A1 | 3/2007 | Shin | |
| 2007/0079191 | A1 | 4/2007 | Shin | |
| 2007/0240024 | A1 | 10/2007 | Shin | |
| 2010/0245305 | A1 * | 9/2010 | Yokoyama | G09G 3/3655 345/205 |
| 2011/0116592 | A1 | 5/2011 | Tsai | |
| 2011/0164017 | A1 * | 7/2011 | Chung | G09G 3/3266 345/211 |
| 2012/0081409 | A1 * | 4/2012 | Chung | G09G 3/3266 345/690 |
| 2012/0139962 | A1 | 6/2012 | Chung et al. | |
| 2014/0002423 | A1 * | 1/2014 | Choi | G09G 3/3688 345/204 |
| 2014/0079176 | A1 | 3/2014 | Qian et al. | |
| 2015/0070258 | A1 * | 3/2015 | Miyake | G09G 3/3677 345/92 |
| 2016/0321999 | A1 * | 11/2016 | Yang | G09G 3/3266 |

FOREIGN PATENT DOCUMENTS

| | | | |
|---|---|---|---|
| CN | 101051440 | A | 10/2007 |
| CN | 101059934 | A | 10/2007 |
| CN | 102831860 | A | 12/2012 |
| CN | 102831861 | A | 12/2012 |
| CN | 202771772 | U | 3/2013 |
| CN | 103198782 | A | 7/2013 |
| CN | 103295641 | A | 9/2013 |
| CN | 103295642 | A | 9/2013 |
| CN | 203849978 | U | 9/2014 |
| EP | 2717269 | A1 | 4/2014 |
| JP | 2003-016794 | A | 1/2003 |
| JP | 2004325940 | A | 11/2004 |
| JP | 2007-086727 | A | 4/2007 |
| JP | 2008-537626 | A | 9/2008 |
| JP | 2009-229683 | A | 10/2009 |
| SU | 756482 | A1 | 8/1980 |
| WO | 2013/153576 | A1 | 10/2013 |

* cited by examiner

SCAN DRIVER AND ORGANIC LIGHT-EMITTING DISPLAY USING SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

TECHNICAL FIELD

The present invention relates to organic light-emitting diode displays and in particular to a scanning driver capable of reducing power consumption and an organic light-emitting display using the scanning driver.

BACKGROUND

The light-emitting devices used in organic light-emitting displays are organic light-emitting diodes (OLEDs). Compared with the thin film transistors (TFTs) in the existing mainstream flat panel display technology, OLEDs, due to their advantages such as high contrast, wide angle of view, low power consumption, smaller size and the like, are expected to become prevailing in the next-generation flat panel display technology beyond LCDs, which is one of technologies that are highly concerned among the existing flat panel display technology.

A conventional scanning driver circuit is formed by a plurality of transistors, a starting signal line IN, timing clock lines CLK1 and CLK2, a high-level power supply VGH and a low-level power supply VGL. When the timing clock lines CLK1 and CLK2 hop, due to the presence of a parasitic capacitor in the transistors, a weak reverse current is generated in the circuit. Therefore, a reverse current of several or more milliamperes may be generated when N rows in the entire screen work collaboratively, thereby leading to non-uniform display on the screen and excessively high power consumption.

SUMMARY

Technical Problems

In view of the problem of excessively high power consumption of the scanning driver in the traditional technologies, a device is provided to reduce the reverse current of a scanning driver of an OLED display.

Technical Solution to the Problem

To solve the above technical problem, the present invention provides a scanning driver, including: a plurality of cascaded structures receiving signals from a first timing clock line and a second timing clock line with opposite phases, the cascaded structures successively generating scanning signals. Each of the cascaded structures includes: a first transistor connected to a starting signal line or to a scanning output line of a previous cascaded structure; a second transistor connected to the second timing clock line and to a scanning output line; a third transistor connected to a high-level power supply VGH, the third transistor including a gate connected to an output terminal of the second transistor; a fourth transistor connected to a low-level power supply VGL and to an output terminal of the third transistor, the fourth transistor including a gate connected to the first timing clock line; a fifth transistor connected to a high-level power supply VGH and to a scanning output line, the fifth transistor including a gate connected to an output terminal of the fourth transistor and to an output terminal of the third transistor; and a first capacitor connected between an output terminal of the first transistor and the scanning output line.

Preferably, each of the cascaded structures further includes a second capacitor connected between an output terminal of the first transistor and a fixed potential.

Preferably, the fixed potential is a low-level power supply VGL.

Preferably, the fixed potential is a high-level power supply VGH.

Preferably, a first clock terminal of an odd one of the cascade structures is connected to the first timing clock line, and a second clock terminal thereof is connected to the second timing clock line; and a first clock terminal of an even one of the cascade structures is connected to the second timing clock line, and a second clock terminal thereof is connected to the first timing clock line.

Preferably, the transistors are bidirectional PMOS transistors or bidirectional P-type thin film field effect transistors.

The present invention further provides an organic light-emitting display, including: a pixel array, connected to a data line and a scanning output line; a data driver, configured to provide data signals to the data line; a scanning driver, configured to provide scanning signals to the scanning output line; and a timing controller, configured to provide timing signals and a high-level power supply VGH and a low-level power supply VGL to the scanning driver.

Beneficial Effects of the Invention

The present invention provides the following beneficial effects: By adding a first capacitor C1 between the output terminal of M1 and the scanning output line, the first capacitor C1 prevents slight-ON of M2 when the second timing clock line hops, thus reducing the reverse current of the scanning driver, reducing the power consumption, and improving the quality of display of the screen.

DETAILED DESCRIPTION

Figure 1:
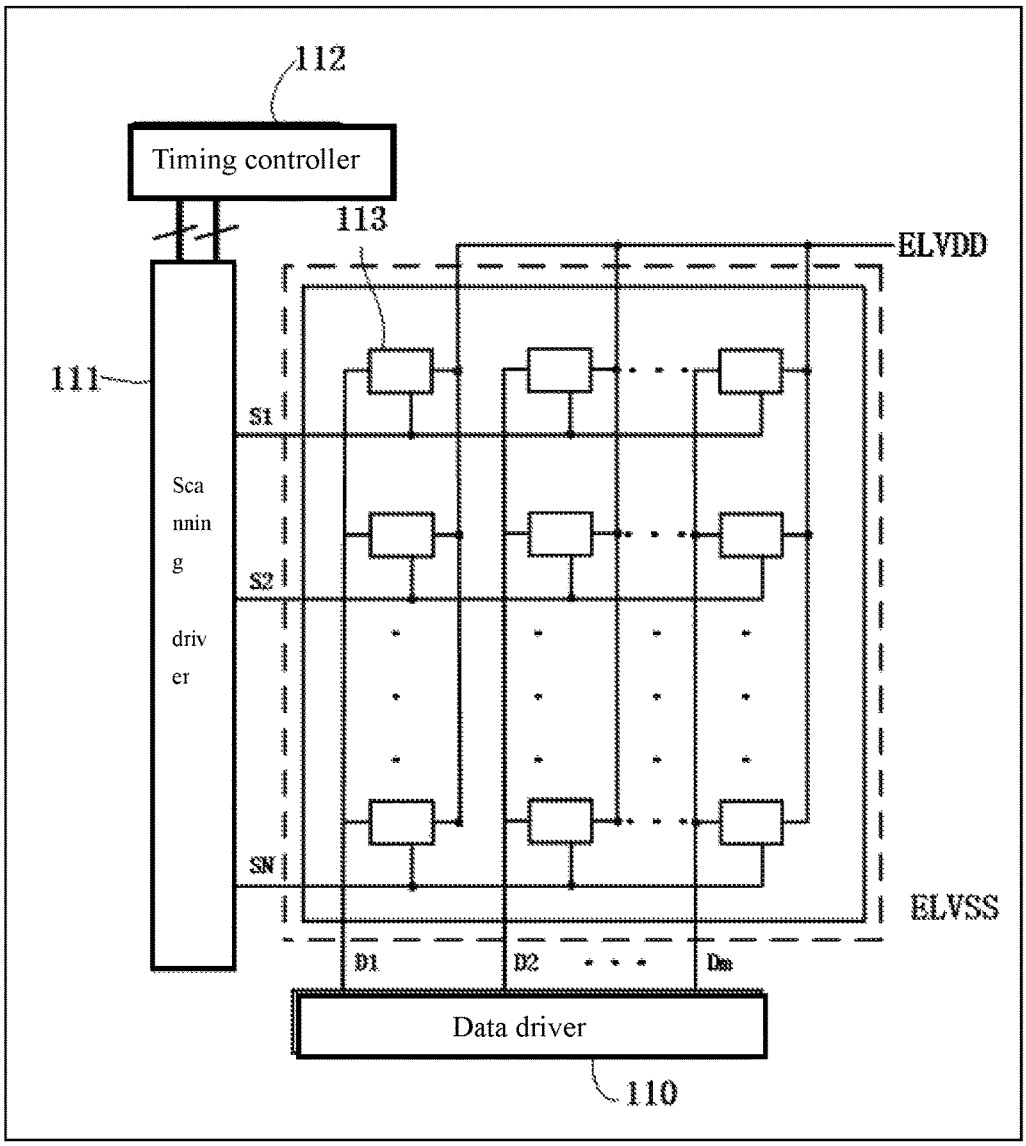
FIG. 1 is a circuit diagram of an organic light-emitting display according to an embodiment of the present invention.

FIG. 1 is a circuit diagram an organic light-emitting display according to an embodiment of the present invention. As shown in FIG. 1, this organic light-emitting display includes a data driver 110 configured to provide data signals to a data line, a scanning driver 111 configured to successively provide scanning signals to scanning output lines, a timing controller 112 configured to provide timing signals and a high-level power supply VGH and a low-level power supply VGL to the scanning driver 111, and a display unit 113 for a plurality of pixels. The function of a scanning driver circuit is to successively generate scanning signals which are to be provided to a display panel to drive pixels in the display panel.

Figure 2:
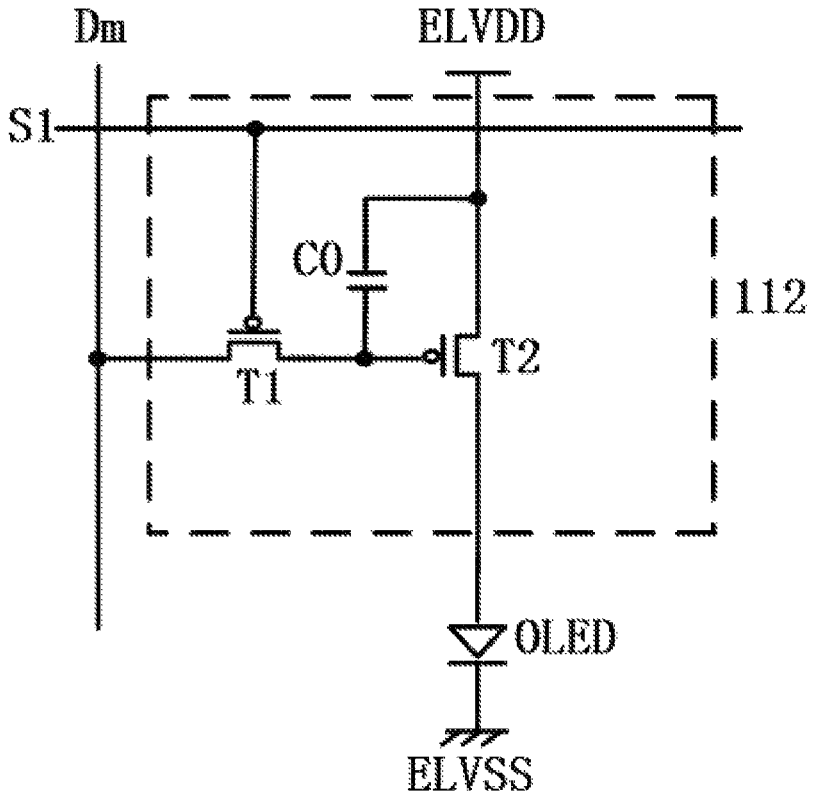
FIG. 2 is a circuit diagram of a pixel display unit in the organic light-emitting display.

FIG. 2 is a circuit diagram of a pixel display unit in the organic light-emitting display. As shown in FIG. 2, this pixel circuit includes a transistor T1, a transistor T2 and a capacitor C0. The gate of T1 is connected to a scanning output line of a scanning driver, and the source of T1 is connected to a data line of a data driver. One terminal of the capacitor C0 is connected to a fixed power supply, and the other terminal thereof is connected to the drain of T1. The gate of T2 is connected to the drain of T1, the source thereof is connected to the fixed power supply, and the drain thereof is connected to an OLED.

The working principle of the circuit is as follows: A scanning driver provides scanning signals to T1 via the scanning output line, and the data driver provides data signals to T1; and when T1 is turned on, a data voltage is transmitted to the gate of T2, and the TFT T2 generates a corresponding current which flows to the OLED such that the OLED emits light.

The scanning driver 111 uses the scanning driver in the following embodiment.

Figure 3:
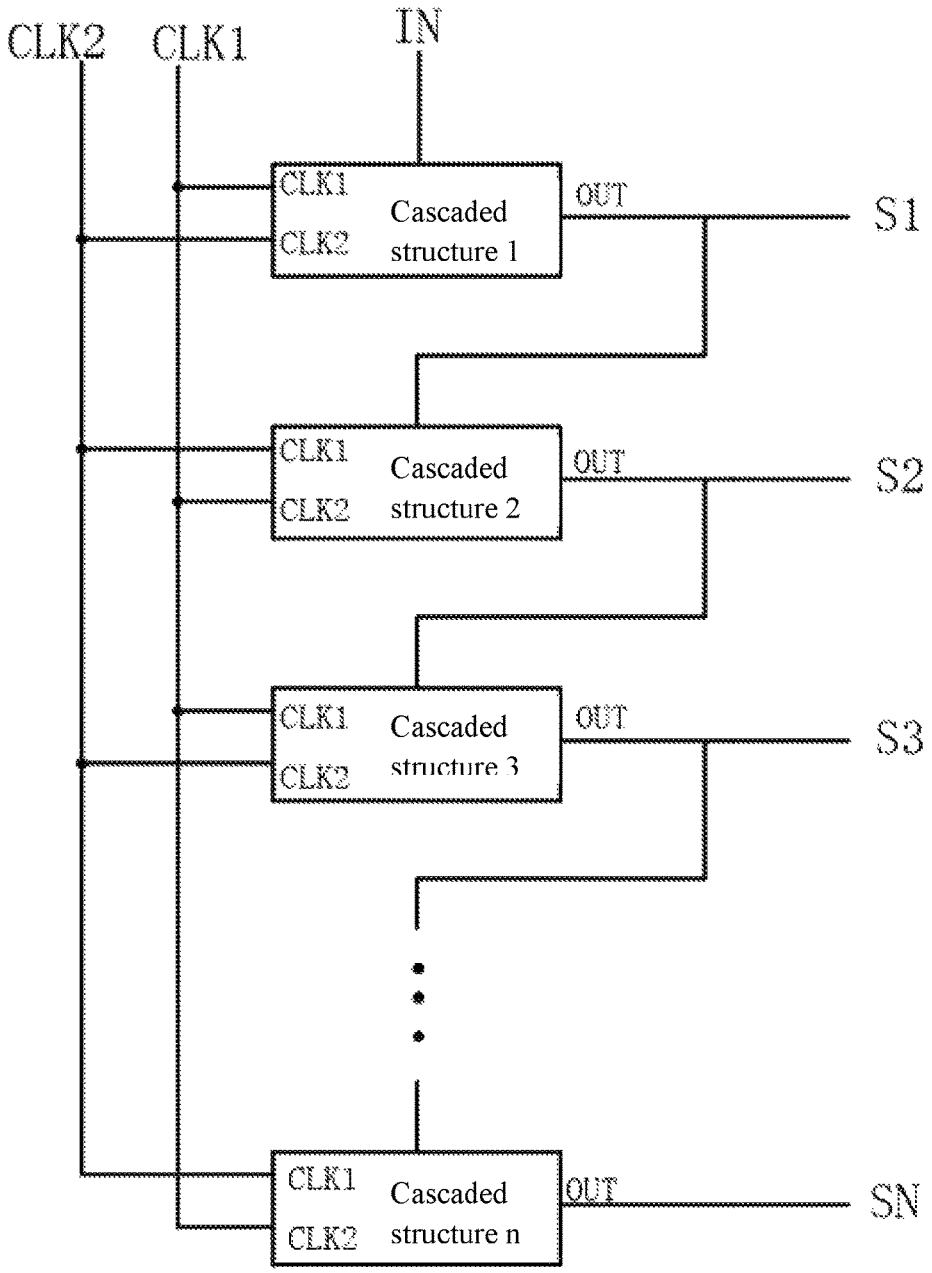
FIG. 3 is a circuit diagram of a scanning driver according to the present invention.

FIG. 3 is a circuit diagram of a scanning driver according to the present invention. As shown in FIG. 3, the scanning driver includes a plurality of cascaded structures, and each of the cascaded structures is connected to timing clock lines CLK1 and CLK2 with opposite phases, and each of the cascaded structures successively generates output signals, i.e., scanning signals, to scanning output lines S1 to SN.

Preferably, a first clock terminal of an odd one of the cascade structures is connected to a first timing clock line, and a second clock thereof is connected to a second timing clock line; and the first clock terminal of an even one of the cascade structures is connected to the second timing clock line, and the second clock terminal is connected to the first timing clock line.

Optionally, a first clock terminal of an odd one of the cascade structures is connected to a second timing clock line, and a second clock thereof is connected to a first timing clock line; and the first clock terminal of an even one of the cascade structures is connected to the first timing clock line, and the second clock terminal is connected to the second timing clock line.

Figure 4:
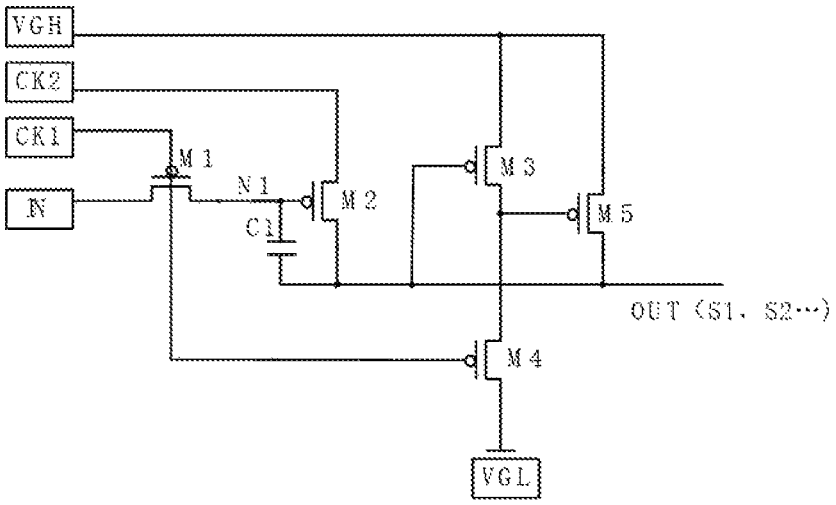
FIG. 4 is a circuit diagram of a cascaded structure 1 of FIG. 3 according to a first embodiment.

FIG. 4 is a circuit diagram of a first embodiment of the cascaded structure 1 of FIG. 3. As shown in FIG. 4, the cascaded structure 1 includes a first transistor M1, a second transistor M2, a third transistor M3, a fourth transistor M4, the fifth transistor M5, a first capacitor C1, a starting signal line IN, a first timing clock line CLK1, a second timing clock line CLK2, a high-level power supply VGH and a low-level power supply VGL.

The gate of the first transistor M1 is connected to the first timing clock line CLK1, the source of M1 is connected to the starting signal line IN, and the drain thereof is connected to the gate of the second transistor M2. The source of the second transistor M2 is connected to the second timing clock line CLK2, and the drain thereof is connected to the scanning output line. The gate of the third transistor M3 is connected to the drain of the second transistor, the source thereof is connected to the high-level power supply VGH, and the drain thereof is connected to the source of the fourth transistor M4. The gate of the fourth transistor M4 is connected to the first timing clock line CLK1, the source thereof is connected to the drain of M3, and the drain of M4 is connected to the low-level power supply VGL. The gate of the fifth transistor M5 is connected to the source of M4, the source of M5 is connected to the high-level power supply VGH, and the drain of the M5 is connected to the scanning output line. One terminal of the first capacitor C1 is connected to the drain of M1, and the other terminal thereof is connected to the scanning output line.

Preferably, the transistors M1, M2, M3, M4, M5 employ a bidirectional PMOS transistor or a bidirectional P-type thin film field effect transistor, and the source and the drain thereof are replaceable.

Figure 5:
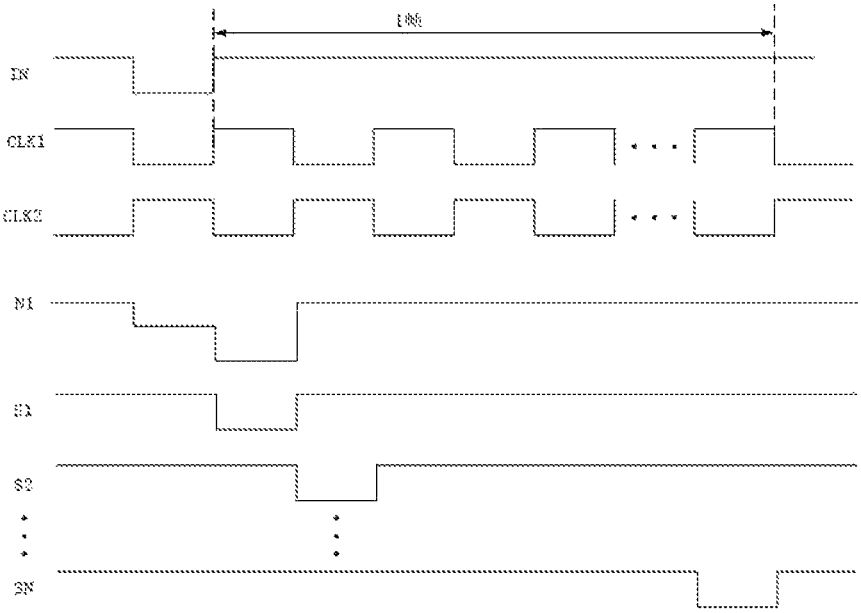
FIG. 5 is a circuit timing diagram of the cascaded structure 1 of FIG. 4 in one frame.

FIG. 5 is a timing diagram of the cascaded structure of FIG. 4 in one frame. As shown in FIG. 5, IN is a timing diagram of a starting signal line, CLK1 is a timing diagram of a first timing clock line, CLK2 is a timing diagram of a second timing clock line, N1 is a timing diagram of an output terminal of M1, and S1 to SN respectively are timing diagrams of scanning output lines of cascaded structures 1 to n. The working principle of the circuit of the cascaded structure 1 is as follows.

When a signal of the starting signal line IN hops to a low level, CLK1 hops to a low level, and CLK2 hops to a high level, M1 is turned on and an output voltage N1 thereof is low-level VGL+Vth (Vth is the absolute value of the threshold voltage). The capacitor C1 is charged. The gate of M2 is in a low level and the source thereof is in a high level, M2 is thus turned on such that S1 outputs a high level. Since CLK1 is in a low level and M4 is also turned on and outputs a low level to the gate of M5, M5 is turned on such that M5 outputs a high level VGH to S1.

When the signal of the starting signal line IN hops to a high level, CLK1 hops to a high level, and CLK2 hops to a low level, M1 is turned off. When CLK2 is in a high level, due to the discharging of the capacitor C1, N1 may be temporarily maintained in a low level VGL+Vth (Vth is the absolute value of the threshold voltage), and M2 is maintained in an ON state; and When CLK2 becomes from a high level to a low level, due to the coupling of the capacitor C1, the voltage of terminal N1 drops from VGL+Vth to 2 VGL+Vth (Vth is the absolute value of the threshold voltage of M1), and M2 is still maintained in an ON state, such that the drain of M2 outputs a low level to S1. The gate of M3 is in a low level and the source thereof is in a high level, such that M3 is turned on and outputs a high level. As a result, the gate of M5 is in a high level, such that M5 is turned off. Thus, S1 may be maintained to output a stable low level.

When the starting signal line IN is continuously maintained in a high level while CLK1 is in a low level and CLK2 is in a high level, M1 is turned ON, terminal N1 is turned to a high level, C1 is charged again. The gate of M2 is turned to a high level, such that M2 is turned off. M4 is turned on since CLK1 is turned to a low level, and outputs a low level to the gate of M5. M5 is turned on, and outputs a high level VGH to S1. When CLK1 is in a high level and CLK2 is in a low level, M1 is turned off, and terminal N1 is maintained in a high level such that M2 is also turned off. Furthermore, slight-ON of M2 is prevented due to the discharging of C1. CLK1 is in a high level, and M4 is turned off. The drain of M4 is maintained in a low level, such that M5 is continuously maintained in an ON state and S1 continuously outputs a high level.

In a similar manner, when the starting signal line IN is maintained in a high level in one frame, S1 continuously outputs a high level.

In the absence of the capacitor C1, after CLK1 is turned to a high level, M1 is turned off, and the voltage of terminal N1 drops quickly. Due to the presence of a parasitic capacitor in M2, M2 is slightly turned on in a process during which CLK2 is turned from a high level to a low level. Since M5 has been turned on, a reverse current flowing from VGH to terminal OUT and then from terminal OUT to CLK2 is generated. When the plurality of cascaded structures work at the same time, a reverse current of several or higher milliamperes will be generated, low potential of CLK2 and CLK 1 will rise. As a result, the power consumption of the driving scanner is excessively high and the display of the screen becomes non-uniform, and consequently the quality of display of the screen is significantly influenced.

In the presence of the capacitor C1, after M1 is turned off, the capacitor C1 can maintain the original high level of the terminal N1, thereby preventing the slight-ON of M2, reducing the power consumption of the scanning driver, and improving the quality of display of the screen.

Preferably, the transistors are bidirectional PMOS transistors or bidirectional P-type thin film field effect transistors.

Similarly, the cascaded structures 2 to n successively receive signals from a scanning output line of a previous cascaded structure, and the timing hopping thereof is as shown in FIG. 5.

In the technical solution according to this embodiment, by adding a first capacitor C1 between the output terminal of M1 and the scanning output line, the first capacitor C1 prevents slight-ON of M2 when the second timing clock line hops, thus reducing the reverse current of the scanning driver, reducing the power consumption, and improving the quality of display of the screen.

Figure 6:
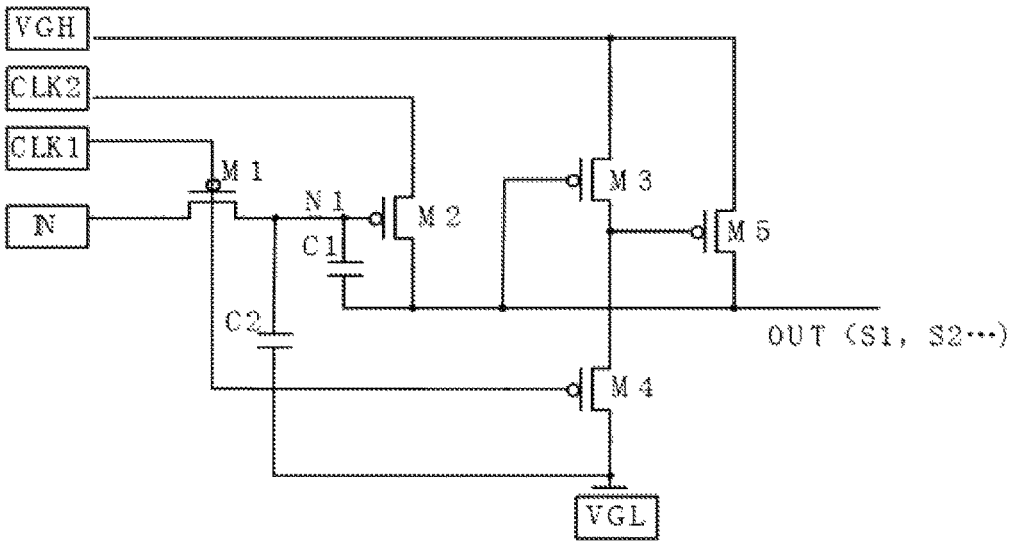
FIG. 6 is a circuit diagram of the cascaded structure 1 of FIG. 3 according to a second embodiment.

FIG. 6 is a circuit diagram of the cascaded structure 1 of FIG. 3 according to a second embodiment. The circuit further includes a second capacitor C2 connected between the output terminal of the first transistor M1 and the fixed potential.

The fixed potential is a low-level power supply VGL.

In the technical solution according to this embodiment, the second transistor C2 can further maintain the voltage of terminal N1 stable and minimize the voltage difference of the first capacitor C1 and the current leakage.

Figure 7:
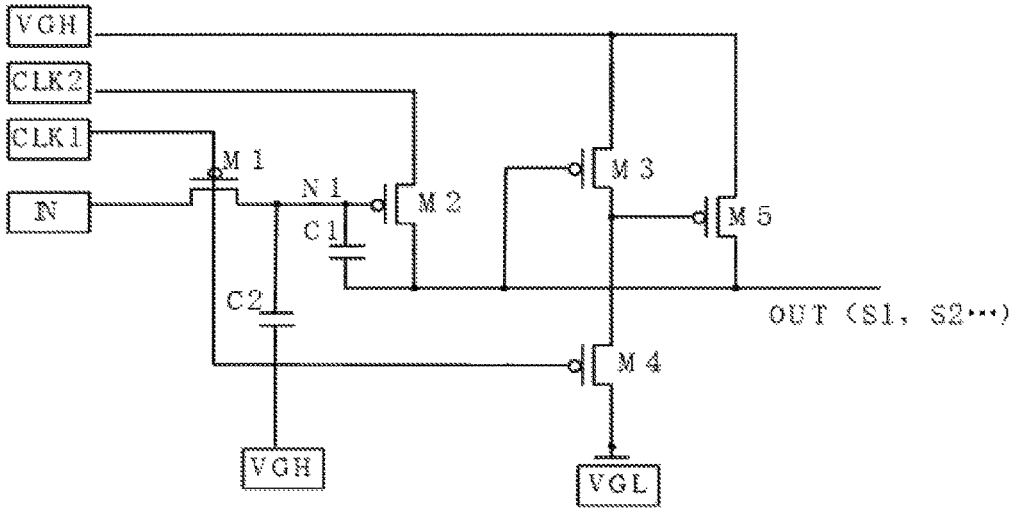
FIG. 7 is a circuit diagram of the cascaded structure 1 of FIG. 3 according to a third embodiment.

FIG. 7 is a circuit diagram of the cascaded structure 1 of FIG. 3 according to a third embodiment. The circuit further includes a second capacitor C2 connected between the output terminal of the first transistor M1 and the fixed potential.

The fixed potential is a high-level power supply VGH.

In the technical solution according to this embodiment, the second transistor C2 can further maintain the voltage of terminal N1 stable and minimize the voltage difference of the first capacitor C1 and the current leakage.

In another embodiment illustrating the organic light-emitting display according to the present invention, the organic light-emitting display includes a data driver configured to provide data signals to a data line, a scanning driver configured to successively provide scanning signals to scanning output lines, a timing controller configured to provide timing signals and a high-level power supply VGH and a low-level power supply VGL to the scanning driver, and a display unit for a plurality of pixels. The function of a scanning driver circuit is to successively generate scanning signals provided to a display panel to drive pixels in the display panel.

The scanning driver includes a plurality of cascaded structures, and each of the cascaded structures is connected to timing clock lines CLK1 and CLK2 with opposite phases, and each of the cascaded structures successively generates output signals, i.e., scanning signals, to scanning output lines S1 to SN.

Each of the cascaded structures specifically includes a first transistor M1, a second transistor M2, a third transistor M3, a fourth transistor M4, a fifth transistor M5, a first capacitor C1, a starting signal line IN, a first timing clock line CLK1, a second timing clock line CLK2, a high-level power supply VGH and a low-level power supply VGL.

Preferably, a first clock terminal of an odd one of the cascade structures is connected to a first timing clock line, and a second clock thereof is connected to a second timing clock line; and the first clock terminal of an even one of the cascade structures is connected to the second timing clock line, and the second clock terminal is connected to the first timing clock line.

Preferably, the transistors are bidirectional PMOS transistors or bidirectional P-type thin film field effect transistors.

The specific circuit structures are the same as the above embodiment and will not be repeated here.

In the technical solution according to this embodiment, by adding a first capacitor C1 between the output terminal of M1 and the scanning output line, the first capacitor C1 prevents slight-ON of M2 when the second timing clock line hops, thus reducing the reverse current of the scanning driver, reducing the power consumption, and improving the quality of display of the screen.

In another embodiment illustrating the organic light-emitting display according to the present invention, the organic light-emitting display includes a data driver configured to provide data signals to a data line, a scanning driver configured to successively provide scanning signals to scanning output lines, a timing controller configured to provide timing signals and a high-level power supply VGH and a low-level power supply VGL to the scanning driver, and a display unit for a plurality of pixels. The function of a scanning driver circuit is to successively generate scanning signals provided to a display panel to drive pixels in the display panel.

The scanning driver includes a plurality of cascaded structures, and each of the cascaded structures is connected to timing clock lines CLK1 and CLK2 with opposite phases, and each of the cascaded structures successively generates output signals, i.e., scanning signals, to scanning output lines S1 to SN.

Each of the cascaded structures specifically includes a first transistor M1, a second transistor M2, a third transistor M3, a fourth transistor M4, a fifth transistor M5, a first capacitor C1, a starting signal line IN, a first timing clock line CLK1, a second timing clock line CLK2, a high-level power supply VGH and a low-level power supply VGL. The circuit further includes a second transistor C2 connected between the output terminal of the first transistor M1 and the fixed potential. The fixed potential is a low-level power supply VGL.

The specific circuit structures are the same as the above embodiment and will not be repeated here.

In the technical solution according to this embodiment, the second transistor C2 can further maintain the voltage of terminal N1 stable and minimize the voltage difference of the first capacitor C1 and the current leakage.

In another embodiment illustrating the organic light-emitting display according to the present invention, the organic light-emitting display includes a data driver configured to provide data signals to a data line, a scanning driver configured to successively provide scanning signals to scanning output lines, a timing controller configured to provide timing signals and a high-level power supply VGH and a low-level power supply VGL to the scanning driver, and a display unit for a plurality of pixels. The function of a scanning driver circuit is to successively generate scanning signals provided to a display panel to drive pixels in the display panel.

The scanning driver includes a plurality of cascaded structures, and each of the cascaded structures is connected to timing clock lines CLK1 and CLK2 with opposite phases, and each of the cascaded structures successively generates output signals, i.e., scanning signals, to scanning output lines S1 to SN.

Each of the cascaded structures specifically includes a first transistor M1, a second transistor M2, a third transistor M3, a fourth transistor M4, a fifth transistor M5, a first capacitor C1, a starting signal line IN, a first timing clock line CLK1, a second timing clock line CLK2, a high-level power supply VGH and a low-level power supply VGL. The circuit further includes a second transistor C2 connected between the output terminal of the first transistor M1 and the fixed potential. The fixed potential is a high-level power supply VGH.

The specific circuit structures are the same as the above embodiments, which are thus not described herein any further.

In the technical solution according to this embodiment, the second transistor C2 can further maintain the voltage of terminal N1 stable and minimize the voltage difference of the first capacitor C1 and the current leakage.

It should be noted that, the above embodiments are merely provided for explaining but not limiting the present invention, and the present invention is not limited to the examples list above. Any technical solutions and improvements made without departing from the spirit and scope of the resent invention should be included in the scope defined by the claims of the present invention.

What is claimed is:

1. A scanning driver, comprising: a plurality of cascaded structures receiving signals from a first timing clock line and a second timing clock line with opposite phases, the cascaded structures successively generating scanning signals, wherein each of the cascaded structures comprises:

*a scanning output line, used to output the scanning signals;* a first transistor, connected to a starting signal line or to [a] *the* scanning output line of the previous cascaded structure, the first transistor comprising a gate connected to the first timing clock line;

a second transistor, connected to the second timing clock line and the scanning output line, the second transistor comprising a gate connected to an output terminal of the first transistor;

a third transistor, connected to a high-level power supply VGH, the third transistor comprising a gate connected to an output terminal of the second transistor;

a fourth transistor, connected to a low-level power supply VGL and to an output terminal of the third transistor, the fourth transistor comprising a gate connected to the first timing clock line;

a fifth transistor, connected to a high-level power supply VGH and to [a] *the* scanning output line, the fifth transistor comprising a gate connected to an output terminal of the fourth transistor and to [an] *the* output terminal of the third transistor; and a first capacitor, connected between [an] *the* output terminal of the first transistor and the scanning output line.

2. The scanning driver according to the claim 1, wherein each of the cascaded structures further comprises:

a second capacitor, connected between the output terminal of [an] *the* first transistor and a fixed potential.

3. The scanning driver according to the claim 2, characterized in that the fixed potential is [a] *the* low-level power supply VGL.

4. The scanning driver according to claim 3, wherein the [transistors] *first through fifth transistor* are bidirectional PMOS transistors or bidirectional P-type thin film field effect transistors.

5. An organic light-emitting display, comprising a pixel array, connected to a data line and [a] *the* scanning output line;

a data driver, configured to provide data signals to the data line;

[a] *the* scanning driver *of claim 4*, configured to provide scanning signals to the scanning output line[as defined in claim 4]; and a timing controller, configured to provide timing signals and [a] *the* high-level power supply VGH and [a] *the* low-level power supply VGL to the scanning driver.

6. An organic light-emitting display, comprising a pixel array, connected to a data line and [a] *the* scanning output line;

a data driver, configured to provide data signals to the data line;

[a] *the* scanning [driver] *drive of claim 3*, configured to provide scanning signals to the scanning output line[as defined in claim 3]; and a timing controller, configured to provide timing signals and [a] *the* high-level power supply VGH and [a] *the* low-level power supply VGL to the scanning driver.

7. The scanning driver according to the claim 2, wherein the fixed potential is [a] *the* high-level power supply VGH.

8. The scanning driver according to claim 7, wherein the [transistors] *first through fifth transistor* are bidirectional PMOS transistors or bidirectional P-type thin film field effect transistors.

9. An organic light-emitting display, comprising a pixel array, connected to a data line and [a] *the* scanning output line;

a data driver, configured to provide data signals to the data line;

[a] *the* scanning [driver] *drive of claim 8*, configured to provide scanning signals to the scanning output line[as defined in claim 8]; and a timing controller, configured to provide timing signals and [a] *the* high-level power supply VGH and [a] *the* low-level power supply VGL to the scanning driver.

10. An organic light-emitting display, comprising a pixel array, connected to a data line and [a] *the* scanning output line;

a data driver, configured to provide data signals to the data line;

[a] *the* scanning [driver] *drive of claim 7*, configured to provide scanning signals to the scanning output line[as defined in claim 7]; and a timing controller, configured to provide timing signals and [a] *the* high-level power supply VGH and [a] *the* low-level power supply VGL to the scanning driver.

11. The scanning driver according to claim 2, wherein the [transistors] *first through fifth transistor* are bidirectional PMOS transistors or bidirectional P-type thin film field effect transistors.

12. An organic light-emitting display, comprising a pixel array, connected to a data line and [a] *the* scanning output line;

a data driver, configured to provide data signals to the data line;

[a] *the* scanning driver *of claim 11*, configured to provide scanning signals to the scanning output line[as defined in claim 11]; and a timing controller, configured to provide timing signals and [a] *the* high-level power supply VGH and [a] *the* low-level power supply VGL to the scanning driver.

13. An organic light-emitting display, comprising a pixel array, connected to a data line and [a] *the* scanning output line;

a data driver, configured to provide data signals to the data line;

[a] *the* scanning driver *of claim 2*, configured to provide scanning signals to the scanning output line[as defined in claim 2]; and a timing controller, configured to provide timing signals and [a] *the* high-level power supply VGH and [a] *the* low-level power supply VGL to the scanning driver.

14. The scanning driver according to the claim 1, wherein a first clock terminal of an odd one of the cascade structures is connected to the first timing clock line, and a second clock terminal thereof is connected to the second timing clock line; and a first clock terminal of an even one of the cascade structures is connected to the second timing clock line, and a second clock terminal thereof is connected to the first timing clock line.

15. The scanning driver according to claim 14, wherein the [transistors] *first through fifth transistor* are bidirectional PMOS transistors or bidirectional P-type thin film field effect transistors.

16. An organic light-emitting display, comprising a pixel array, connected to a data line and [a] *the* scanning output line;

a data driver, configured to provide data signals to the data line;

[a] *the* scanning driver *of claim 15*, configured to provide scanning signals to the scanning output line [as defined in claim 15]; and a timing controller, configured to provide timing signals and [a] *the* high-level power supply VGH and [a] *the* low-level power supply VGL to the scanning driver.

17. An organic light-emitting display, comprising a pixel array, connected to a data line and [a] *the* scanning output line;

a data driver, configured to provide data signals to the data line;

[a] *the* scanning driver *of claim 14*, configured to provide scanning signals to the scanning output line[as defined in claim 14]; and a timing controller, configured to provide timing signals and [a] *the* high-level power supply VGH and [a] *the* low-level power supply VGL to the scanning driver.

18. The scanning driver according to claim 1, wherein the [transistors] *first through fifth transistor* are bidirectional PMOS transistors or bidirectional P-type thin film field effect transistors.

[19. The scanning driver according to claim 18, wherein the transistors are bidirectional PMOS transistors or bidirectional P-type thin film field effect transistors.]

20. An organic light-emitting display, comprising a pixel array, connected to a data line and [a] *the* scanning output line;

a data driver, configured to provide data signals to the data line;

[a] *the* scanning driver *of claim 1*, configured to provide scanning signals to the scanning output line[as defined in claim 1]; and a timing controller, configured to provide timing signals and [a] *the* high-level power supply VGH and [a] *the* low-level power supply VGL to the scanning driver.

* * * * *